United States Patent
Li et al.

(10) Patent No.: US 12,211,947 B2
(45) Date of Patent: *Jan. 28, 2025

(54) COPPER, INDIUM, GALLIUM, SELENIUM (CIGS) FILMS WITH IMPROVED QUANTUM EFFICIENCY

(71) Applicant: Applied Materials, Inc., Santa Clara, CA (US)

(72) Inventors: Philip Hsin-hua Li, San Jose, CA (US); Seshadri Ramaswami, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/133,602

(22) Filed: Apr. 12, 2023

(65) Prior Publication Data

US 2023/0275165 A1    Aug. 31, 2023

Related U.S. Application Data

(63) Continuation of application No. 16/702,107, filed on Dec. 3, 2019, now Pat. No. 11,728,449.

(51) Int. Cl.
  H01L 31/0392    (2006.01)
  H01L 31/0749    (2012.01)
  H01L 31/18      (2006.01)

(52) U.S. Cl.
  CPC .... H01L 31/03928 (2013.01); H01L 31/0749 (2013.01); H01L 31/18 (2013.01)

(58) Field of Classification Search
  CPC .......... H01L 31/03928; H01L 31/0749; H01L 31/18
  See application file for complete search history.

(56) References Cited

U.S. PATENT DOCUMENTS

| 4,318,938 | A |   | 3/1982  | Barnett |                     |
|-----------|---|---|---------|---------|---------------------|
| 5,436,204 | A | * | 7/1995  | Albin   | ......... H01L 31/0322 |
|           |   |   |         |         | 136/258             |
| 6,310,281 | B1|   | 10/2001 | Wendt   |                     |
| 7,544,884 | B2| * | 6/2009  | Hollars | ............. C23C 14/562 |
|           |   |   |         |         | 257/431             |

(Continued)

OTHER PUBLICATIONS

Matsushima (Year: 2008).*

(Continued)

*Primary Examiner* — Sadie White
(74) *Attorney, Agent, or Firm* — Lowenstein Sandler LLP

(57) ABSTRACT

A method includes forming, on a substrate by performing physical vapor deposition in vacuum, an absorber layer including copper (Cu), indium (In), gallium (Ga) and selenium (Se), forming a stack including the substrate and an oxygen-annealed absorber layer by performing in-situ oxygen annealing of the absorber layer to improve quantum efficiency of the image sensor by passivating selenium vacancies due to dangling bonds, and forming a cap layer over the oxygen-annealed absorber layer by performing physical vapor deposition in vacuum. The cap layer includes at least one of: $Ga_2O_3 \cdot Sn$, ZnS, CdS, CdSe, ZnO, ZnSe, $ZnIn_2Se_4$, $CuGaS_2$, $In_2S_3$, MgO, or $Zn_{0.8}Mg_{0.2}O$.

13 Claims, 7 Drawing Sheets

(56) References Cited

U.S. PATENT DOCUMENTS

| | | |
|---|---|---|
| 7,576,017 B2 | 8/2009 | Tuttle |
| 8,241,943 B1 | 8/2012 | Wieting |
| 8,648,253 B1 | 2/2014 | Woods |
| 9,583,655 B2 | 2/2017 | Cheng |
| 2004/0115559 A1* | 6/2004 | Kato ..................... G11B 7/266 430/270.13 |
| 2005/0109392 A1 | 5/2005 | Hollars |
| 2006/0267054 A1 | 11/2006 | Martin |
| 2009/0223551 A1 | 9/2009 | Reddy |
| 2010/0248419 A1 | 9/2010 | Woodruff |
| 2010/0294346 A1 | 11/2010 | Frolov |
| 2011/0048524 A1 | 3/2011 | Nam |
| 2011/0174363 A1 | 7/2011 | Munteanu |
| 2011/0237019 A1 | 9/2011 | Horng |
| 2011/0315221 A1 | 12/2011 | Hunt |
| 2012/0017973 A1 | 1/2012 | Beck |
| 2013/0327398 A1 | 12/2013 | Dhere |
| 2014/0273335 A1 | 9/2014 | Abushama |
| 2015/0027537 A1 | 1/2015 | Teraji |
| 2016/0284882 A1 | 9/2016 | Jang |
| 2016/0336475 A1 | 11/2016 | Mackie |
| 2017/0110616 A1 | 4/2017 | Dissanayake |

OTHER PUBLICATIONS

Rau, et al. "Oxygenation and Air-Annealing Effects on the Electronic Properties of Cu(In,Ga)Se2 Films and Devices", Journal of Applied Physics, vol. 86, No. 1, Jul. 1, 1999, 10 pages.

Kronik, et al., Thin Solid Films, 2000, 361-362, 535-359 (Year: 2000).

\* cited by examiner

COPPER, INDIUM, GALLIUM, SELENIUM (CIGS) FILMS WITH IMPROVED QUANTUM EFFICIENCY

CROSS-REFERENCE TO RELATED APPLICATION(S)

The present application is a continuation of U.S. patent application Ser. No. 16/702,107, filed on Dec. 3, 2019 and entitled "COPPER, INDIUM, GALLIUM, SELENIUM (CIGS) FILMS WITH IMPROVED QUANTUM EFFICIENCY", the entire contents of which are incorporated by reference herein.

TECHNICAL FIELD

Embodiments of the present disclosure relate to photovoltaic devices generally. Particularly, to a method of manufacturing photovoltaic devices with increased quantum efficiency, the resultant photovoltaic devices, a method of manufacturing copper, indium, gallium, selenium (CIGS) films with improved quantum efficiency, and to the resultant CIGS films.

BACKGROUND $Cu(In,Ge)Se_2$ (CIGS)-based polycrystalline films are used in the solar industry as well as for image sensor applications. In the solar industry, CIGS layers are typically deposited using co-evaporation of 4 different elements: Cu, In, Ga, and $Se_2$. After deposition of the CIGS layer, the film is typically subjected to an air break during its transfer from one processing chamber to the next. The air break exposes the CIGS film to an environment (e.g., atmosphere) and to conditions (e.g., moisture) that may create interface charges (also referred to as "interface traps") on the surface of the CIGS layer. One example of a condition that may create an interface trap is exposure of the CIGS film to moisture in the environment. Such interface charges may contribute to electron recombination, contribute to electron losses, degrade the charge collection of a photo-generated carrier comprising the CIGS film, and reduce the overall quantum efficiency of the CIGS-based polycrystalline films.

SUMMARY

According to embodiments described herein is a method for manufacturing a photovoltaic device. The method may comprise performing physical vapor deposition to deposit an absorber layer comprising an absorber material over a substrate. The physical vapor deposition of the absorber layer may be performed in vacuum. The method may further comprise performing in-situ oxygen annealing of the absorber layer. The method may further comprise performing physical vapor deposition to deposit a cap layer over the oxygen annealed absorber layer. The physical vapor deposition of the cap layer may be performed in vacuum. The physical vapor deposition of the cap layer on the oxygen annealed absorber layer may be performed without exposing the absorber layer to air or moisture.

Also described in embodiments herein is a photovoltaic device comprising a bottom contact layer deposited over a substrate; a p-type layer deposited over the bottom contact layer; an n-type layer deposited over the p-type layer; a hole blocker layer deposited over the n-type cap layer; and a top contact layer deposited over the n-type cap layer. The photovoltaic device may have a quantum efficiency (QE) greater than about 50%, e.g., when measured at a voltage of about −1 V and at a wavelength of about 940 nm.

Also described in embodiments herein is a method for manufacturing a photovoltaic device. The method may comprise depositing a bottom contact layer on a substrate. The method may further comprise performing physical vapor deposition to deposit an absorber layer comprising an absorber material over the bottom contact layer. The physical vapor deposition of the absorber layer may be performed in vacuum. The method may further comprise performing in-situ oxygen annealing of the absorber layer. The method may further comprise performing physical vapor deposition to deposit a cap layer over the oxygen annealed absorber layer. The physical vapor deposition of the cap layer may be performed in vacuum. The physical vapor deposition of the cap layer on the oxygen annealed absorber layer may be performed without exposing the absorber layer to air or moisture. The method may further comprise depositing a hole blocker layer over the cap layer. The method may further comprise depositing a top contact layer over the hole-blocker layer.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Figure 1:
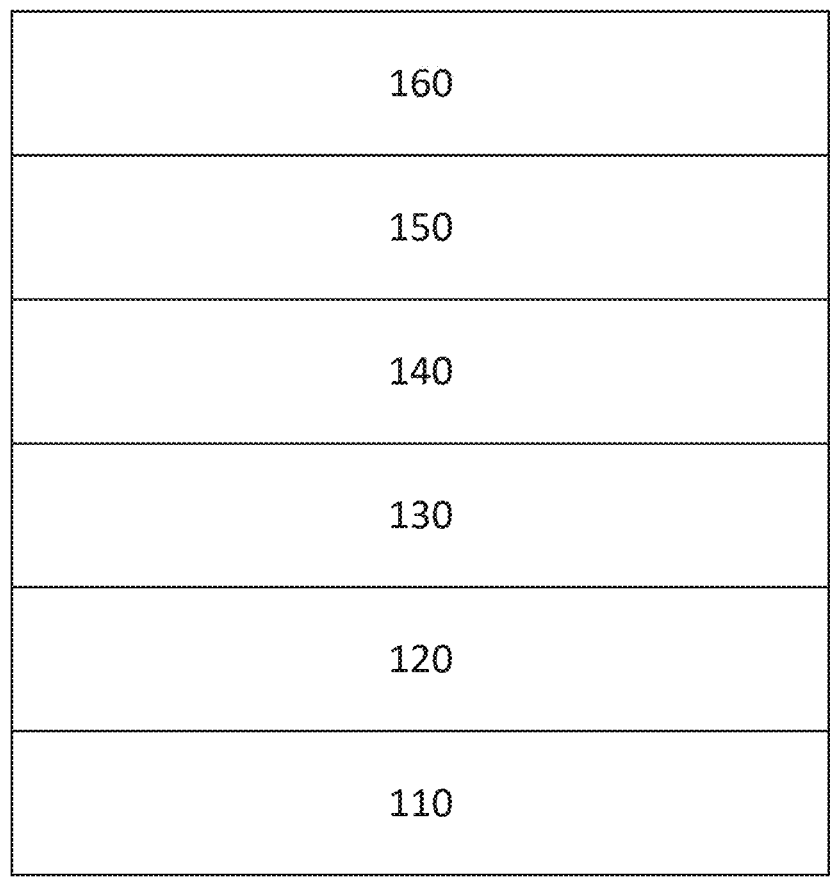
FIG. 1 depicts a cross-sectional view of an exemplary photovoltaic device, in accordance with some embodiments.

Embodiments described herein relate to photovoltaic devices, methods of manufacturing thereof, a CIGS absorber layer, and methods of manufacturing thereof in order to increase their quantum efficiency.

Currently, photovoltaic devices may be manufactured (e.g., in the solar industry) by depositing a CIGS absorber layer in one chamber using co-evaporation, followed by an air break for transferring the CIGS-containing layer into another chamber, and further followed by additional processing of the rest of a stack comprising the CIGS absorber layer to generate the photovoltaic device. In current processes, the CIGS absorber layer may be deposited by co-evaporation of four different elements: copper (Cu), indium (In), gallium (Ga), and selenium ($Se_2$). The air break that traditionally occurs upon transferring the CIGS-containing stack from one chamber to another exposes the CIGS-containing stack to an outside environment (e.g., air) and outside moisture. Existing processes used for manufacturing a photovoltaic device and/or a CIGS absorber layer expose the CIGS absorber layer to moisture and other conditions that form interface traps on the CIGS layer. Such interface traps facilitate electron recombination, cause electron losses, hinder charge collection of photo-generated carriers, and/or reduce overall quantum efficiency of manufactured photovoltaic devices.

The methods described herein improve quantum efficiency and enhance collection of photo-generated carriers while minimizing their loss due to interface traps. Additionally, the CIGS absorber layers described in embodiments exhibit superior properties as compared to conventionally formed CIGS layers. For example, CIGS layers formed in embodiments, as well as photovoltaic devices containing such CIGS layers, may exhibit lower electron recombination, lower electron losses, increased charge collection of photo-generated carriers and/or increased overall quantum efficiency as compared to CIGS layers and photovoltaic devices formed using conventional techniques.

In some embodiments, described herein is a method for manufacturing a photovoltaic device by performing physical vapor deposition (PVD) of an absorber layer (e.g., CIGS layer) over a substrate. The PVD of the absorber layer may occur in vacuum. With the PVD process, all four elements of a CIGS absorber layer may be deposited in a single chamber without exposing the CIGS absorber layer to an air break and without exposing the CIGS absorber layer to moisture. The omission of an air break and/or moisture may reduce interface traps, which could improve the quantum efficiency of the absorber layer and preserve the sensitivity of the resulting photovoltaic device formed using the CIGS layer.

The PVD deposited absorber layer (e.g., CIGS layer) may subsequently be subjected to in-situ oxygen annealing. The in-situ oxygen annealing may passivate selenium vacancies due to dangling bonds terminated at the surface of a CIGS absorber layer. This passivation of dangling bonds may further reduce interface traps and may further improve the quantum efficiency of the absorber layer and of the resultant photovoltaic device.

"External Quantum Efficiency" or "EQE" or "QE" of a solar cell, a photodiode and an image sensor is the percentage of photons incident to the device's photoreactive surface that produce charge carriers which are being collected at the electrodes. QE indicates electrical sensitivity of the device to light.

FIG. 1 is a cross-sectional view of an exemplary photovoltaic device 100, in accordance with some embodiments. An exemplary photovoltaic device 100 may comprise a substrate 110, a bottom contact layer 120, an absorber layer 130, a cap layer 140, a hole-blocker layer 150, and a top contact layer 160. On top of contact layer 160 there may further be an anti-reflective coating (not shown), that also may be referred to as an arc layer. On top of the arc layer there may also be a microlens (not shown), for instance, for camera applications. Absorber layer 130 and cap layer 140 may both comprise a semiconductor material and provide a p-n or an n-p junction. When the photovoltaic device 100 absorbs light 170 (e.g., sun light, laser light, camera light, and so on) through a microlens, electric current may be generated at the p-n or n-p junction. However, charge recombinations due to interface traps may cause a drop in the quantum efficiency of the photovoltaic device 100. The methods described herein reduce interface traps and charge recombinations and improve the quantum efficiency of the photovoltaic device 100.

Figure 6:
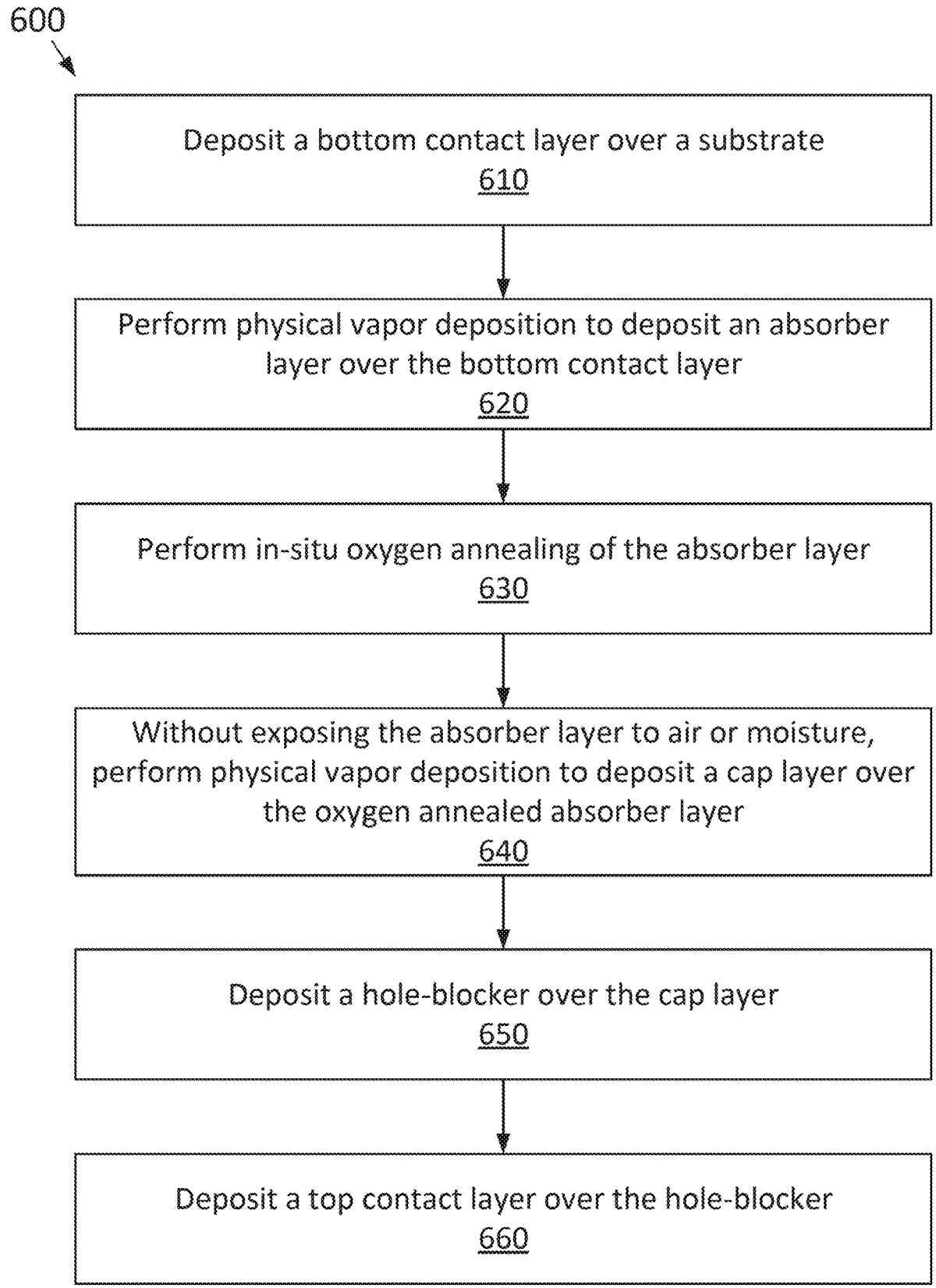
FIG. 6 depicts a method for manufacturing a photovoltaic device according to embodiments.

FIG. 6 depicts a method 600 for manufacturing a photovoltaic device 100 according to some embodiments. In some embodiments, the methods described herein may comprise depositing a bottom contact layer 120 over a substrate 110, in accordance with block 610 in method 600 in FIG. 6. The substrate 110 may include, without limitations, glass or Si wafer or another transparent material (such as $SiO_2$, soda lime glass, Si substrate, or sapphire), a polymer film (such as polyimide), and metal foils (such as stainless steel or aluminum), or a combination thereof. Substrate 110 may be amorphous, polycrystalline, or crystalline. Other suitable substrate materials may also be used. In some embodiments, the substrate may be cleaned before deposition of subsequent layers thereon. The thickness of the substrate 110 may be in any suitable range, for example, in the range of about 0.1 mm to about 5 mm, about 0.5 mm to about 4 mm, or about 1 mm to about 3 mm.

A bottom contact layer 120 may be deposited over the substrate 110. The bottom contact layer 120 may comprise a conductive material. A potential may be applied to the bottom contact layer 120 and to the top contact layer 160 (also comprising a conductive material) to generate a current. The bottom contact layer 120 may include, without limitations, molybdenum (Mo), copper (Cu), nickel (Ni), titanium nitride (TiN), tungsten (W), tantalum (Ta), vanadium (V), titanium (Ti), niobium (Nb), zirconium (Zr), a combination thereof, or any other suitable metals (e.g., conductive materials). In certain embodiments, molybdenum (Mo) may be used for the bottom contact layer 120 due to the low contact resistance between Mo and a CIGS absorber layer. The material for the bottom contact layer may be selected to as to provide for a low contact resistance in the interface between the bottom contact layer 120 and the absorber layer 130. The thickness of the bottom contact layer 120 may be in any suitable range, for example, in the range of about 100 nm to about 1.5 microns, from about 200 nm to about 1.2 micron, or from about 300 nm to about 1 micron. The bottom contact layer 120 is a primary electrode and its thickness should be selected so as to balance between its contact resistance and throughput.

In an embodiment, the bottom contact layer may comprise a layer of titanium nitride (TiN) and a layer of molybdenum (Mo). For instance, the bottom contact layer 120 may comprise TiN deposited directly over the substrate and a Mo layer deposited on top of the TiN layer. The thickness of the Mo layer may range from about 0.2 microns to about 0.8 microns, from about 0.3 microns to about 0.7 microns, from about 0.4 microns to about 0.6 microns, or about 0.5 microns. The thickness of the TiN may range from about 0.1 microns to about 0.5 microns, from about 0.1 microns to about 0.3 microns, or about 0.2 microns. Bottom contact layer 120 may comprise multiple sub-layers having different atomic compositions and may include, without limitations, molybdenum (Mo), copper (Cu), nickel (Ni), titanium nitride (TiN), tungsten (W), tantalum (Ta), vanadium (V), titanium (Ti), niobium (Nb), zirconium (Zr), a combination thereof, or any other suitable metals (e.g., conductive materials). For instance, in some embodiments, the bottom contact layer may comprise a multi-layer stack of interconnecting layers (e.g., Cu, Ni, Pt, and so on) topped with a Mo layer. The interconnecting layers may have a thickness ranging from about 0.2 microns to about 0.8 microns, from about 0.3 microns to about 0.7 microns, from about 0.4 microns to about 0.6 microns, or about 0.5 microns.

The methods described herein may further comprise performing PVD to deposit absorber layer 130 over the substrate and/or over the bottom contact layer 120, in accordance with block 620 in method 600 depicted in FIG. 6. Absorber layer 130 may be a p-type or an n-type semiconductor material. The absorber layer may absorb light entering the photovoltaic device (e.g., in the form of photon), and may generate a signal (also referred to as current). Examples of materials suitable for absorber layer 130 may include, without limitations, copper indium selenide ($CuInSe_2$), copper indium gallium selenide (CIGS), copper indium aluminum selenide ($CuAlSe_2$), cadmium telluride (CdTe), amorphous silicon (α-Si), copper zinc/iron tin sulfide (C(Z/I)TS), and combinations thereof. In an embodiment, the absorber layer 130 comprises absorber material CIGS having the chemical formula $CuIn_xGa_{(1-x)}Se_2$, where x is in the range of from 0 to 1. In an embodiment, absorber layer 130 comprises a p-type semiconductor absorber material comprising copper, gallium, indium, and selenium (e.g., is a CIGS layer). The thickness of absorber layer 130 may be in any suitable range, for example, in the range of about 0.5 microns to about 10 microns, about 0.75 micron to about 5 microns, or about 1 micron to about 3 microns.

Absorber layer 130 may be formed according to methods such as sputtering, chemical vapor deposition, printing, electrodeposition, physical vapor deposition, or the like. In an embodiment, absorber layer 130 is formed using physical vapor deposition (e.g., sputtering or ion assisted deposition). For example, a CIGS layer may be formed on a substrate or on a bottom contact layer by depositing in vacuum a metal film comprising all four elements (Cu, In, Ga, and $Se_2$) from a single quaternary target. The atomic ratio of various constituents of a CIGS layer may be pre-defined in the quaternary target formation. Alternatively, four different targets (e.g., a Cu target, an In target, a Ga target and a $Se_2$ target) may be used concurrently to co-deposit Cu, In, Ga and $Se_2$. Alternatively, two targets may be used, where one target contains a mixture of a first two elements from a list including Cu, In, Ga and $Se_2$, and another target contains a mixture of the remaining two elements from the list. Alternatively, three targets may be used, wherein one target contains a mixture of three elements from the list and another target contains the remaining element from the list. In 3-target, 2-target, or single-target CIGS deposition methods, the atomic ratio of various constituents of a CIGS layer may be defined either during target formation or by tuning deposition process conditions (e.g., tuning ratio of vapor pressures among different elements).

In another example, a CIGS film may be formed on a substrate or on a bottom contact layer by depositing in vacuum a first metal film from a first target comprising one element, followed by deposition of a second metal film from a second target comprising a second element, followed by deposition of a third metal film from a third target comprising a third element, followed by deposition of a fourth metal film from a fourth target comprising a fourth element. In one embodiment, the various targets may be introduced all into a single chamber under vacuum. In another embodiment, the film may be transferred across multiple chambers having various targets in vacuum and without exposing the film to the outside environment or to moisture. The final absorber layer may form a single poly-crystalline CIGS layer.

In certain embodiments, after depositing the absorber layer 130 (e.g., CIGS layer) on the substrate 110 and/or on the bottom contact layer 120, the absorber layer 130 may be exposed to in-situ oxygen annealing, in accordance with block 630 in method 600 of FIG. 6. The in-situ oxygen annealing may passivate any remaining $Se_2$ vacancies in the absorber layer 130 caused by dangling bonds terminated at the surface of the absorber layer 130. The annealing should be performed at a temperature and for a duration sufficient to passivate a majority of the dangling bonds at the surface of the absorber layer 130 and/or to passivate all of the dangling bonds at the surface of the absorber layer 130. Performing the in-situ oxygen annealing includes heating the absorber layer 130 (and/or the substrate 110 and/or bottom contact layer 120) to a temperature of about 100° C. to about 750° C. for a time of about 5 seconds to about 120 minutes in embodiments.

The in-situ oxygen annealing may be performed using inert gas (e.g., Ar) enriched with oxygen. Oxygen may be pumped into a process chamber holding the substrate 110 prior to and/or during the annealing. Alternatively, a gas mixture (referred to as an "annealing gas") containing oxygen and the inert gas may be pumped into the process chamber. The oxygen concentration in the annealing gas used for in-situ oxygen annealing may range from about 0.2 wt % to about 20 wt %, from about 0.5 wt % to about 10 wt %, or from about 0.8 wt % to about 3 wt %, based on total weight of the annealing gas.

In-situ oxygen annealing may be performed over a duration ranging from about 5 seconds to about 120 minutes, from about 5 minutes to about 90 minutes, from about 10 seconds to about 90 minutes, from about 15 seconds to about 60 minutes, from about 20 seconds to about 45 minutes, from about 25 seconds to about 35 seconds, from about 2 minutes to about 7 minutes, or from about 20 minutes to about 30 minutes.

The in-situ oxygen annealing may be performed at a temperature ranging from about 100° C. to about 750° C., from about 100° C. to about 500° C., from about 150° C. to about 500° C., from about 175° C. to about 250° C., from about 350° C. to about 450° C., from about 175° C. to about 450° C., or from about 250° C. to about 350° C.

The methods described herein may further comprise performing PVD to deposit a cap layer 140 over the absorber layer 130 and/or over any of the layers described hereinbefore. The cap layer 140 may be deposited over absorber layer 130 to insulate the absorber layer 130 from the outside environment and from conditions that may create interface traps (e.g., moisture). In certain embodiments, cap layer 140 may be deposited after absorber layer 130 has been subjected to in-situ oxygen annealing, in accordance with block 640 in method 600 in FIG. 6. In certain embodiments, there may be no air break between deposition (and in-situ oxygen annealing) of absorber layer 130 and deposition of cap layer 140. For instance, absorber layer 130 and cap layer 140 may be deposited in the same deposition chamber. Alternatively, absorber layer 130 may be deposited in a first deposition chamber and cap layer 140 may be deposited in a second deposition chamber and the stack may be transferred from the first deposition chamber to the second deposition chamber in vacuum (i.e., without an air break, exposure to outside environment, or exposure to moisture). For example, two different process chambers may be connected to the same transfer chamber, which may be under vacuum. A robot arm in the transfer chamber may remove the substrate 110 from a first process chamber in which deposition of the bottom contact layer 120 and/or absorber layer 130 may have been performed and may transfer the substrate 110 to a second process chamber for further processing.

Cap layer 140 may be a p-type or an n-type semiconductor material. For instance, if absorber layer 130 is a p-type layer, cap layer 140 may be an n-type layer. Similarly, if absorber layer 130 is an n-type layer, cap layer 140 may be a p-type layer. Examples of materials suitable for cap layer 140 may include, without limitations, $Ga_2O_3$, $SnO_2$, tin doped gallium oxide ($Ga_2O_3 \cdot Sn$), ZnS, CdS, (Cu,Cd)S, (Zn,Cd)S, (Zn,Cd,Cu)S, (Zn,Cd)(S,O), (Zn,Cd,Cu)(S,O), CdSe, ZnO, ZnSe, $ZnIn_2Se_4$, $CuGaS_2$, $In_2S_3$, MgO, $Zn_{0.8}Mg_{0.2}O$, doped variations thereof, and combinations thereof. The thickness of cap layer 140 may be in any suitable range, for example, in the range of about 5 nm to about 100 nm, about 20 nm to about 85 nm, or about 30 nm to about 70 nm. In certain embodiments, the cap layer may be thick enough to have good surface coverage of the underlying absorber layer 130, whose surface could be rough, yet not so thick so as to lose light transmission there-through.

Cap layer 140 may be formed according to methods such as sputtering, chemical vapor deposition, printing, electrodeposition, physical vapor deposition, or the like. In an embodiment, cap layer 140 may be formed using physical vapor deposition. Cap layer 140 may be deposited in the same deposition chamber as absorber layer 130 so as to not expose the absorber layer to the outside environment (such as air and/or moisture). Alternatively, cap layer 140 may be deposited in a different deposition chamber from that of absorber layer 130. However, in an embodiment where absorber layer 130 and cap layer 140 are deposited in different deposition chambers, the substrate having absorber layer 130 thereon may be transferred between the deposition chambers in a controlled environment (e.g., in vacuum and without exposure to air and/or moisture).

In some embodiments, the methods described herein may further comprise depositing a hole blocker layer 150 over cap layer 140 and/or over any of the layers described hereinbefore, in accordance with block 650 in method 600 in FIG. 6. Hole blocker layer 150 may be deposited to reduce leakage or dark current. Hole blocker layer 150 may be formed using methods such as sputtering, chemical vapor deposition, printing, electrodeposition, physical vapor deposition, or the like. In an embodiment, hole blocker layer 150 may be formed using physical vapor deposition. Example materials suitable for hole blocker layer 150 may include, without limitations, metal oxides, such as $Ga_2O_3$, ZnO, and combinations thereof. The thickness of hole blocker layer 150 may be in any suitable range, for example, in the range of about 5 nm to about 500 nm, about 50 nm to about 250 nm, or about 75 nm to about 125 nm.

In some embodiments, the methods described herein may further comprise depositing a top contact layer 160 over hole blocker layer 150 and/or over any of the layers described hereinbefore, in accordance with block 660 in method 600 in FIG. 6. Top contact layer 160 may be a transparent conductive layer with dual functions: transmitting light to an absorber layer 130 while also serving as a top contact to transport photo-generated electrical charges away to form output current.

Top contact layer 160 may be formed using methods such as sputtering, chemical vapor deposition, printing, electrodeposition, physical vapor deposition, or the like. In an embodiment, top contact layer 160 may be formed using physical vapor deposition. Example materials suitable for top contact layer 160 may include transparent conductive oxides, such as, without limitations, indium tin oxide (ITO), zinc oxide (ZnO), fluorine-doped tin oxide (FTO), aluminum doped zinc oxide (AZO), gallium doped zinc oxide (GZO), alumina and gallium co-doped ZnO (AGZO), boron doped ZnO (BZO), and any combinations thereof. The thickness of top contact layer 160 may be in any suitable range, for example, in the range of about 0.1 nm to about 2.5 microns, about 10 nm to about 1 micron, or about 15 nm to about 50 nm.

In certain embodiments, all layers (110-160) may be formed using physical vapor deposition. In other embodiments, some of layer 110-160 may be formed using physical vapor deposition and other layers may be formed using a different deposition technique. In some embodiments, the deposition may be performed in vacuum in a single chamber (e.g., by introducing various targets into the deposition chamber). Alternatively, the deposition may be performed in vacuum in a plurality of chambers (e.g., by moving a wafer from one deposition chamber to another deposition chamber).

Figure 2:
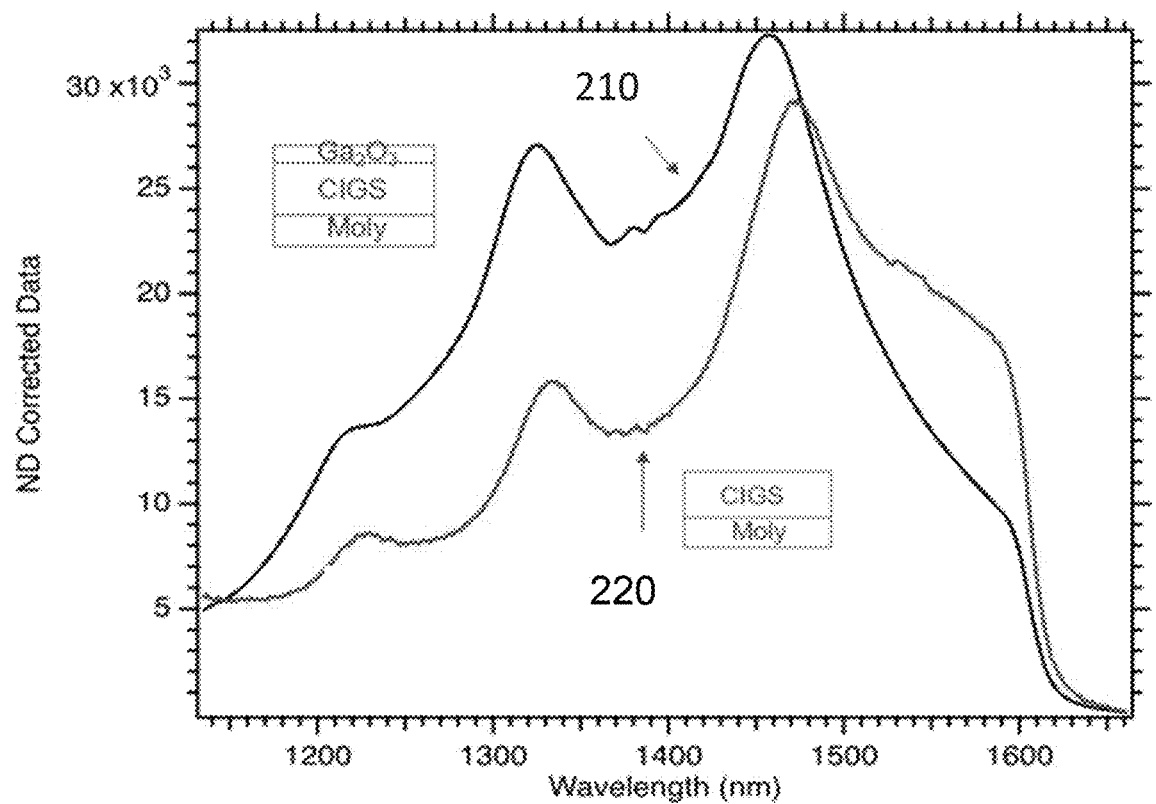
FIG. 2 depicts photoluminescence (PL) data of a capped CIGS absorber layer, prepared without an air break, in accordance with some embodiments, compared to a control CIGS absorber layer, prepared with an air break.

FIG. 2 depicts photoluminescence (PL) data of a capped CIGS absorber layer, prepared without an air break, in accordance with some embodiments, compared to a control CIGS absorber layer, prepared with an air break. The vertical axis depicts a number count of electrons being measured. The horizontal axis depicts a range of wavelengths. Two curves are shown in FIG. 2, curve 210 and curve 220.

Curve 210 depicts raw PL data over a range of wavelengths for a three layer absorber film prepared according to certain embodiments described herein. The three layer absorber film corresponding to PL data of curve 210 comprises a bottom contact layer of molybdenum, an absorber layer of CIGS (p-type layer) deposited over the molybdenum layer, and a cap layer of $Ga_2O_3$ (n-type layer) deposited over the CIGS absorber layer. The various layers (bottom contact layer, CIGS layer, and cap layer) of the three layer absorber film corresponding to PL data of curve 210 were deposited using PVD. The CIGS layer was not exposed to the outside environment (e.g., air and/or moisture) prior to depositing the cap layer of $Ga_2O_3$ (i.e., there was no air break between PVD of the CIGS layer and PVD of the cap layer).

Curve 220 depicts raw PL data multiplied eight times over a range of wavelengths for a comparative two layer absorber film. The comparative two layer absorber film corresponding to PL data of curve 220 comprises a bottom contact layer of molybdenum and an absorber layer of CIGS deposited over the molybdenum layer without a cap layer deposited over the CIGS layer. The various layers (bottom contact layer and CIGS layer) of the comparative two layer absorber film corresponding to PL data of curve 220 were deposited using PVD. However, unlike the three layer absorber film corresponding to the PL data of curve 210, the comparative two layer absorber film corresponding to the PL data of curve 220 was exposed to outside environment (i.e., the comparative absorber film was subjected to an air break).

The CIGS film in the two samples (in the three layer absorber film corresponding to the PL data of curve 210 and in the comparative two layer absorber film corresponding to the PL data of curve 220) is identical. The CIGS film in both samples comprises 35% gallium. The difference between the two samples is the number of layers and the exposure of the comparative two samples to air.

To generate the PL data depicted in FIG. 2, a high power laser was used as a light source (632.8 nm at 10 mW) to artificially inject a known number of electrons (e.g., thousands of electrons) into the two absorber films. The electrons went through different absorptions and finally the PL data depicted in FIG. 2 was collected. The PL data in FIG. 2 indicates the number of electrons being absorbed at different energy levels (i.e., at different wavelengths). A higher electron count coming out as per the PL data of FIG. 2 are indicative of a higher quantum efficiency.

As seen in FIG. 2, the shape of the curves 210 and 220 is similar. However, curve 210 is at least eight times higher than curve 220 (given that curve 220 is a depiction of the raw data multiplied eight times whereas curve 210 is a depiction of the raw data as is without magnification). The higher number count of electrons shown with curve 210 may be correlated with a higher quantum efficiency for the three layer absorber film as compared to the quantum efficiency attained from the comparative two layer absorber film.

The three layer absorber film has a cap layer of gallium oxide that was formed prior to exposure of the absorber film to an external environment. Without being construed as limiting, it is believed that the cap layer provides protection for the CIGS absorber layer from the outside environment (such as air and/or moisture) that may cause interface traps and reduce quantum efficiency. In contrast, the comparative two layer absorber film is missing a cap layer. Accordingly, CIGS layer of the two layer absorber film when exposed to an outside environment, is believed to be more prone to interacting with air and/or moisture and forming interface traps that degrade performance of the CIGS layer, increase electron re-combinations, cause loss of charge carriers, and reduce quantum efficiency. If a cap layer is formed over the CIGS layer of the two layer absorber film after exposure of the CIGS layer to an external environment (e.g., to air and/or moisture), the measurement results is approximately equivalent to the measurement results shown in curve 220 because the CIGS layer will have already interacted with air and/or moisture in the external environment.

Although the shape of curves 210 and 220 is similar, the shape is slightly different at longer wavelengths (e.g., about 1500 to about 1600 nm). Longer wavelengths have low energy and shorter wavelengths have high energy. Without being construed as limiting, it is believed that the shape of curve 220 at longer wavelengths (i.e., at lower energy levels) may be different from the shape of curve 210 because at very low energy levels, there may be multiple interface traps at the CIGS layer that may not be there when the CIGS layer is sealed with a cap layer (such as gallium oxide).

FIGS. 3A through 3D depicts four graphs of a capacitance as a function of frequency of various CIGS absorber layers prepared with or without oxygen annealing at various temperatures. The vertical axis in these four graphs depicts capacitance measured in $nF/cm^2$. The horizontal axis in these four graphs depicts frequency, measured in Hz, in a log scale. Each curve in each graph is a depiction of capacitance as a function of frequency of a CIGS absorber layer subjected to in-situ oxygen annealing at one particular temperature (starting from 100K and until 200K is reached with temperature increments of 20K). Each of the four graphs includes five different capacitance curves at different in-situ oxygen annealing temperatures across a range of frequencies. For each curve, the CIGS absorber layer sample was maintained at a particular temperature (100K, 120K, 140K, 160K, 180K, and 200K) and then was subjected to a sweep of frequencies to measure its capacitance.

Figures 3A, 3B, 3C, 3D:
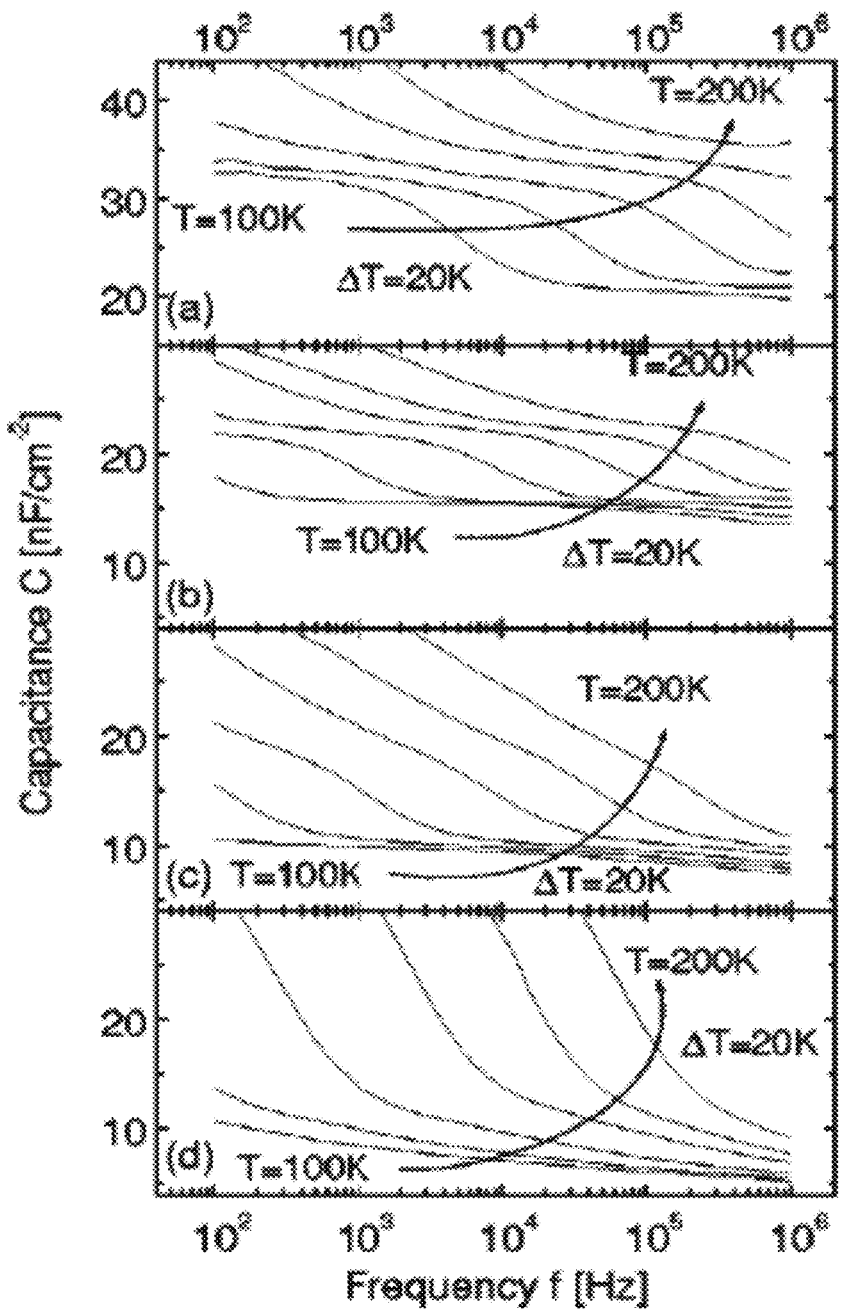
FIG. 3A depicts capacitance as a function frequency of various CIGS absorber layers prepared without oxygen annealing at various temperatures (100K, 120K, 140K, 160K, 180K, and 200K).
FIG. 3B depicts capacitance as a function of frequency of various CIGS absorber layers prepared with 30 seconds of oxygen annealing at various temperatures (100K, 120K, 140K, 160K, 180K, and 200K), in accordance with some embodiments.
FIG. 3C depicts capacitance as a function of frequency of various CIGS absorber layers prepared with 5 minutes of oxygen annealing over various temperatures (100K, 120K, 140K, 160K, 180K, and 200K), in accordance with some embodiments.
FIG. 3D depicts capacitance as a function of frequency of various CIGS absorber layers prepared with 24 minutes of oxygen annealing over various temperatures (100K, 120K, 140K, 160K, 180K, and 200K), in accordance with some embodiments.

Each of the four graphs was associated with different in-situ oxygen annealing duration after deposition of the CIGS absorber layer. FIG. 3A depicts capacitance as a function frequency of various CIGS absorber layers prepared without oxygen annealing at various temperatures (100K, 120K, 140K, 160K, 180K, and 200K). FIG. 3B depicts capacitance as a function frequency of various CIGS absorber layers prepared with 30 seconds of oxygen annealing at various temperatures (100K, 120K, 140K, 160K, 180K, and 200K). FIG. 3C depicts capacitance as a function frequency of various CIGS absorber layers prepared with 5 minutes of oxygen annealing over various temperatures (100K, 120K, 140K, 160K, 180K, and 200K). FIG. 3D depicts capacitance as a function frequency of various CIGS absorber layers prepared with 24 minutes of oxygen annealing over various temperatures (100K, 120K, 140K, 160K, 180K, and 200K).

It was identified that longer duration of in-situ oxygen annealing after deposition of a CIGS absorber layer was associated with a lower capacitance at a given temperature and at a given frequency. For instance, when the CIGS absorber layer was not subjected to any in-situ oxygen annealing, the capacitance at a frequency of 1 MHz and at 200K was about 35 $nF/cm^2$; when the CIGS absorber layer was subjected to 30 seconds in-situ oxygen annealing, the capacitance at a frequency of 1 MHz and at 200K was about 20 $nF/cm^2$; when the CIGS absorber layer was subjected to 5 minutes in-situ oxygen annealing, the capacitance at a frequency of 1 MHz and at 200K was about 12 $nF/cm^2$; and when the CIGS absorber layer was subjected to 24 minutes in-situ oxygen annealing, the capacitance at a frequency of 1 MHz and at 200K was about 9 $nF/cm^2$. These capacitance numbers are summarized in Table 1 below.

The capacitance is an indication of the amount of charge in a given material. Lower capacitance may be indicative of lower amount of interface charges in the interface between the CIGS absorber layer and the top layer (e.g., cap layer) after in-situ oxygen annealing. With a lower amount of interface charges, less electrons may recombine, there may be lower electron loss and higher quantum efficiency.

In some embodiments, photovoltaic devices described herein may have a capacitance lower than about 30 $nF/cm^2$, lower than about 20 $nF/cm^2$, lower than about 15 $nF/cm^2$, or lower than about 10 $nF/cm^2$, when measured at a frequency of about 1 MHz and at a temperature of about 200° K.

TABLE 1

| Anneal Time | Capacitance (nF/cm$^2$) at 1 MHz and at 200 K |
|---|---|
| 0 seconds | 35 |
| 30 seconds | 20 |
| 5 minutes | 12 |
| 24 minutes | 9 |

FIG. 2 depicts the improved quantum efficiency associated with omitting an air break (i.e., exposure to outside environment such as water and/or air) after depositing a CIGS absorber layer. Omission of the air break may be accomplished by depositing a cap layer over the CIGS absorber layer. The cap layer may be deposited in the same deposition chamber as the CIGS absorber layer without removing the CIGS absorber layer from the deposition chamber until the cap layer has been deposited thereon. Alternatively, the cap layer and the CIGS absorber layer may be deposited in multiple deposition chambers in a controlled environment (such as vacuum environment) so that if the CIGS absorber layer gets transferred from one deposition chamber to another, it is not exposed to the outside environment during the transfer. FIG. 3 depicts the improved quantum efficiency associated with in-situ oxygen annealing of a deposited CIGS absorber layer.

FIGS. 4A through 4D depict the effect on quantum efficiency of the combination of a cap layer (or omission of air break) with the in-situ oxygen annealing (1 wt % oxygen and 99 wt % argon) as compared to the effect of a cap layer individually. The data in FIGS. 4A through 4D was obtained by subjecting the samples to natural light using a camera. The QE of each sample at −1V and at 940 nm is summarized below and in Table 2.

Figure 4A:
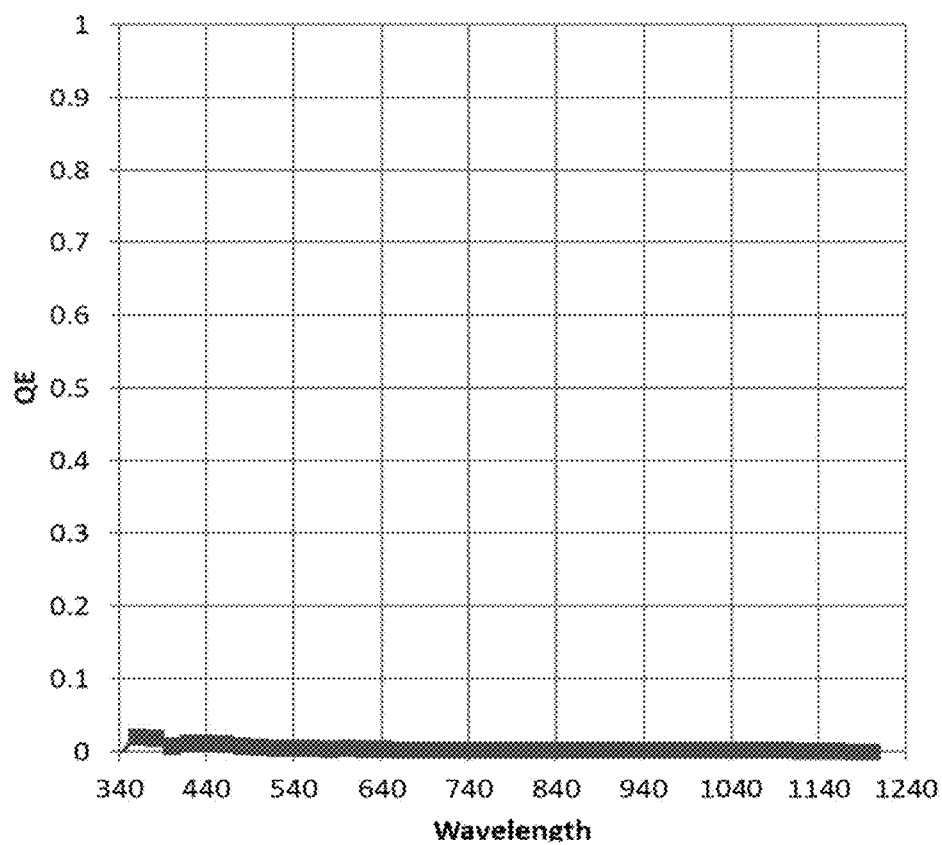
FIG. 4A depicts QE as a function of wavelength for a photovoltaic device prepared without capping (i.e., with an air break) and without oxygen annealing.

FIG. 4A depicts QE as a function of wavelength for a control photovoltaic device prepared without capping (i.e., with an air break) and without oxygen annealing. The QE at −1V and at 940 nm was 0%.

Figure 4B:
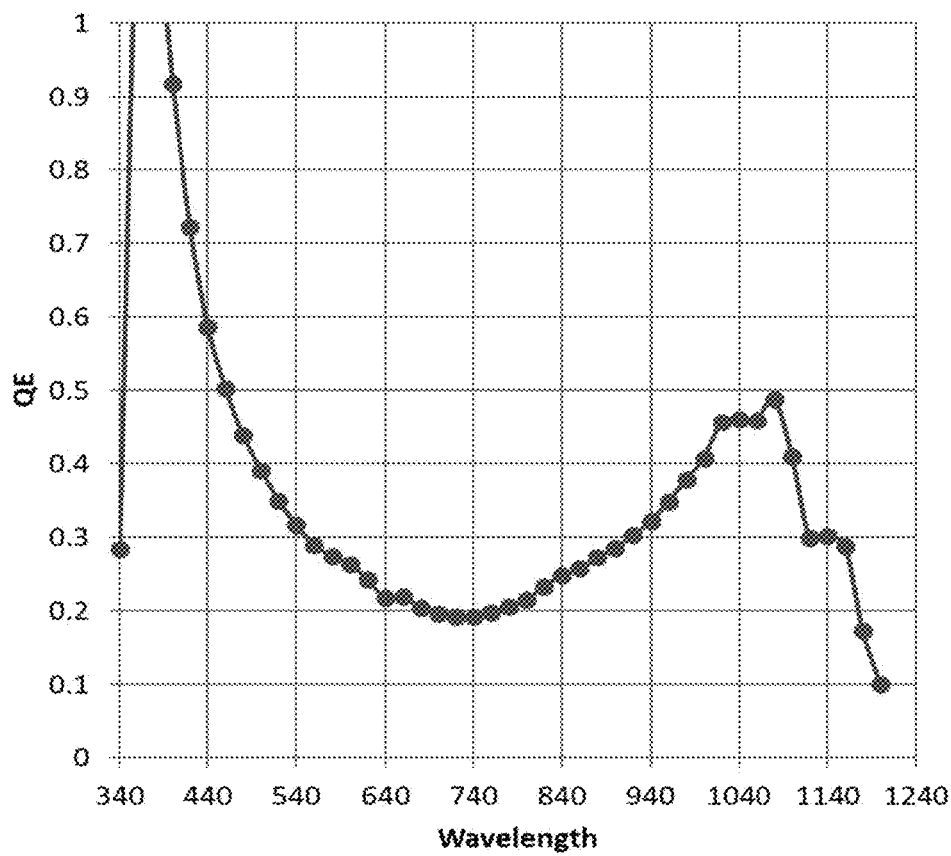
FIG. 4B depicts QE as a function of wavelength for a photovoltaic device prepared with capping (i.e., without an air break), in accordance with some embodiments, and without oxygen annealing.

FIG. 4B depicts QE as a function of wavelength for a photovoltaic device prepared with capping (i.e., without an air break) in a continuous process, in accordance with some embodiments, and without oxygen annealing. The QE at −1V and at 940 nm was about 33%.

Figure 4C:
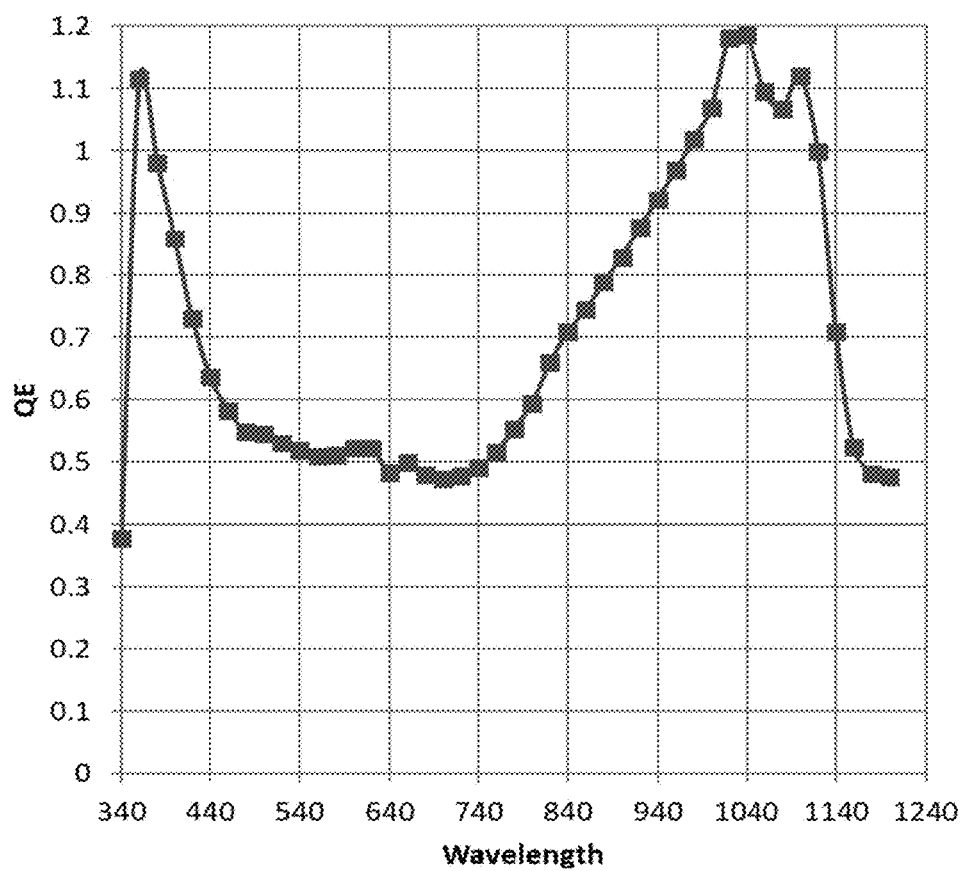
FIG. 4C depicts QE as a function of wavelength for a photovoltaic device prepared with capping (i.e., without an air break) and with in-situ oxygen annealing, in accordance with some embodiments.

FIG. 4C depicts QE as a function of wavelength for a photovoltaic device prepared with capping (i.e., without an air break) in a continuous process and with in-situ oxygen annealing at 200° C. for 30 minutes, in accordance with some embodiments. The QE at −1V and at 940 nm was about 92%.

Figure 4D:
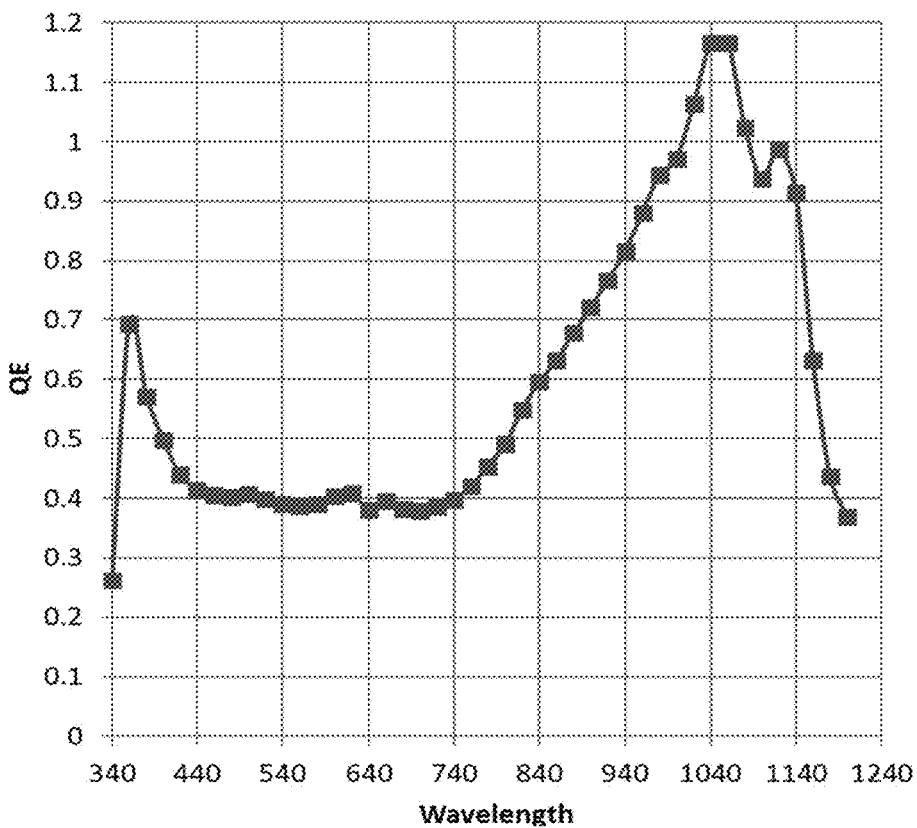
FIG. 4D depicts QE as a function of wavelength for a photovoltaic device prepared with capping (i.e., without an air break) and with in-situ oxygen annealing, in accordance with some embodiments.

FIG. 4D depicts QE as a function of wavelength for a photovoltaic device prepared with capping (i.e., without an air break) in a continuous process and with in-situ oxygen annealing at 400° C. for 30 minutes, in accordance with some embodiments. The QE at −1V and at 940 nm was about 82%.

TABLE 2

| | | CIGS Post-Process | | | |
|---|---|---|---|---|---|
| FIG. | Air Break | 1% O$_2$ anneal for 30 min | N-Layer | Hole-Blocker | QE at −1V at 940 nm |
| 4A | Yes | No | Ga$_2$O$_3$•Sn | Ga$_2$O$_3$ | ~0% |
| 4B | No | No | | | 33% |
| 4C | No | Yes (200° C.) | | | 92% |
| 4D | No | Yes (400° C.) | | | 82% |

As shown in FIGS. 4A and 4B, introducing a cap layer over a CIGS absorber layer in a continuous process (i.e., without an air break), improves the QE of the CIGS absorber layer. As further shown in FIGS. 4C-4D, subjecting a CIGS absorber layer to in-situ oxygen annealing after its deposition and before deposition of a cap layer, followed by deposition of a cap layer over the CIGS absorber layer in a continuous process (i.e., without an air break), further improves the QE of the resulting film.

In some embodiments, photovoltaic devices described herein may have a QE greater than about 50%, greater than about 60%, greater than about 70%, greater than about 80%, greater than about 85%, greater than about 90%, greater than about 95%, or greater than about 98%, when measured at a voltage of about −1V and at a wavelength of about 940 nm.

Figure 5A:
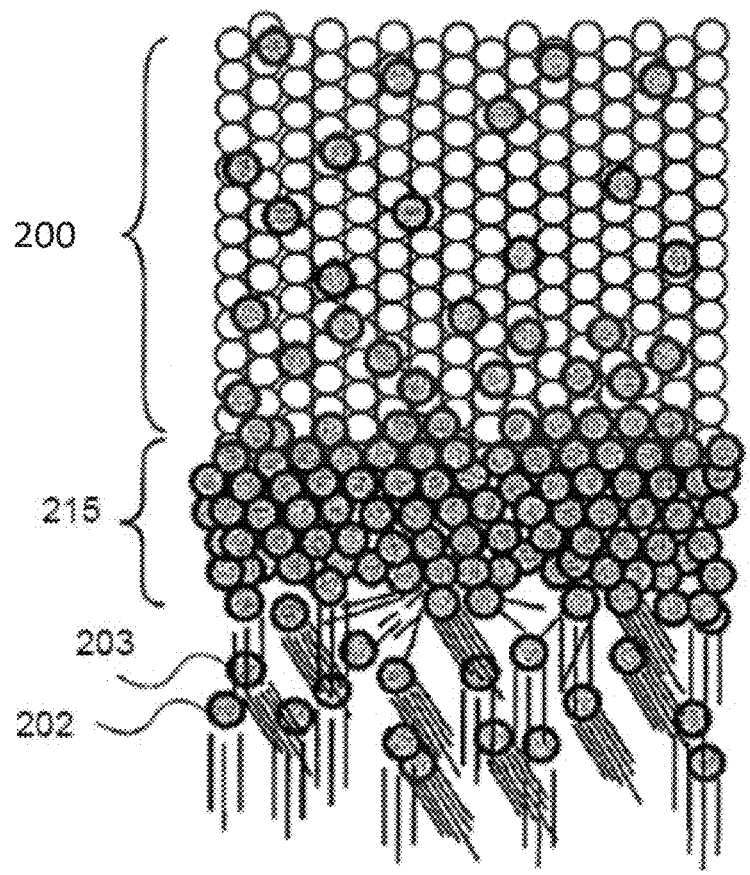
FIG. 5A depicts a deposition mechanism applicable to a variety of deposition techniques utilizing energetic particles such as ion assisted deposition (IAD).
Figure 5B:
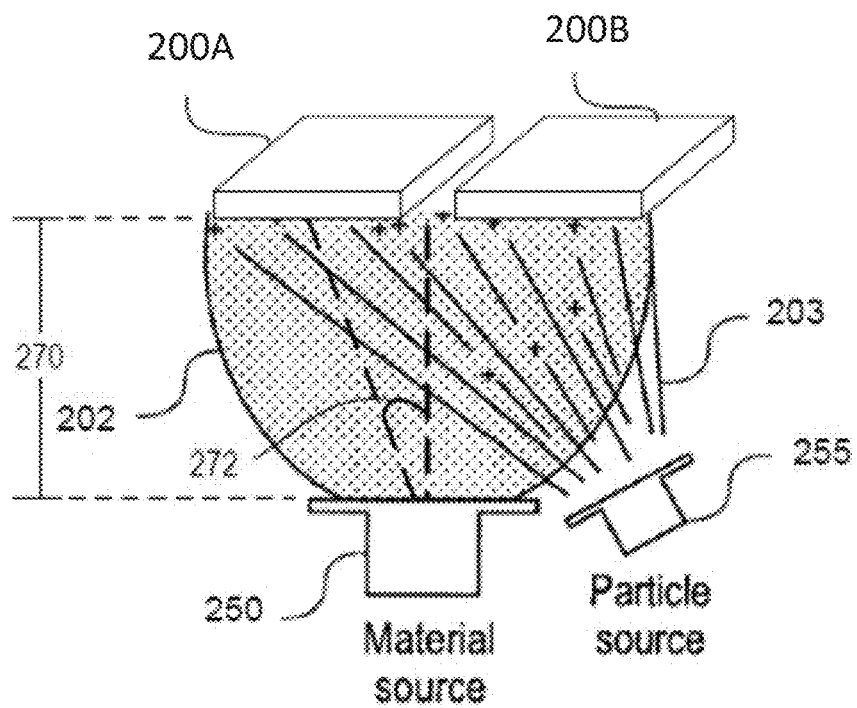
FIG. 5B depicts a schematic of an IAD deposition apparatus.

FIGS. 5A and 5B depict a deposition mechanism and device applicable to a variety of deposition techniques utilizing energetic particles such as ion assisted deposition (IAD) and PVD. Some embodiments are discussed with reference to IAD. However, it should be understood that alternative embodiments may also be used with PVD deposition techniques. Exemplary IAD methods include deposition processes which incorporate ion bombardment, such as evaporation (e.g., activated reactive evaporation (ARE) or electron beam ion assisted deposition (EB-IAD)) and sputtering (e.g., ion beam sputtering ion assisted deposition (IBS-IAD)) in the presence of ion bombardment to form layers of the photovoltaic devices as described herein. EB-IAD may be performed by evaporation. IBS-IAD may be performed by sputtering a solid target material. Any of the IAD or PVD methods may be performed in the presence of a reactive gas species, such as O$_2$, N$_2$, halogens, etc. Such reactive species may burn off surface organic contaminants prior to and/or during deposition.

In one embodiment, EB-IAD is utilized to form the CIGS absorber layer and/or the cap layer deposited thereon. In another embodiment, IBS-IAD is utilized to form the CIGS absorber layer and/or the cap layer deposited thereon. In yet another embodiment, PVD is utilized to form the CIGS absorber layer and/or the cap layer deposited thereon.

As shown, a material source 250 provides a flux of deposition materials 202 while an energetic particle source 255 provides a flux of the energetic particles 203, both of which impinge upon the articles 200, 200A, 200B throughout the IAD process. The energetic particle source 255 may be an oxygen, nitrogen or other ion source. The energetic particle source 255 may also provide other types of energetic particles such as inert radicals, neutron atoms, and nano-sized particles which come from particle generation sources (e.g., from plasma, reactive gases or from the material source that provide the deposition materials).

IAD coating target material can be calcined powders, preformed lumps (e.g., formed by green body pressing, hot pressing, and so on), a sintered body (e.g., having 50-100% density), or a machined body (e.g., can be ceramic, metal, or a metal alloy). In one embodiment, the material source (e.g., target body) used to provide the deposition materials comprises material(s) (e.g., metallic materials) corresponding to the same material(s) that the absorber layer and/or the cap layer is to be composed of. For example, the material source comprise at least one of copper, indium, gallium, and/or selenium. Other target materials may also be used, such as powders, calcined powders, preformed material (e.g., formed by green body pressing or hot pressing), or a machined body (e.g., fused material). All of the different types of material sources 250 are melted into molten material sources during deposition. However, different types of starting material take different amounts of time to melt. Fused materials and/or machined bodies may melt the quickest. Preformed material melts slower than fused materials, calcined powders melt slower than preformed materials, and standard powders melt more slowly than calcined powders. To form complex oxide compositions, various metal alloys may be used as the target material.

IAD may utilize one or more plasmas or beams (e.g., electron beams) to provide the material and energetic ion sources. The energetic particles 203 may be controlled by the energetic ion (or other particle) source 255 independently of other deposition parameters. The energy (e.g., velocity), density and incident angle of the energetic ion flux may be adjusted to control a composition, structure, crystalline orientation and grain size of the thin film protective layer. Additional parameters that may be adjusted are a temperature of the article during deposition as well as the duration of the deposition.

The ion assist energy is used to densify the deposited material 215 and to accelerate the deposition of the material on the surface of the substrate. Ion assist energy can be varied using both the voltage and current of the ion source. The voltage and current can be adjusted to achieve high and low density of the deposited material, to manipulate a stress of the deposited material, and also a crystallinity of the deposited material. The ion assist energy can also be used to intentionally change a stoichiometry of the deposited material.

Deposition temperature can be controlled by using heaters to heat a deposition chamber and/or a substrate and by adjusting a deposition rate. In one embodiment, an IAD deposition chamber (and the article therein) is heated to a starting temperature of 160° C. or higher prior to deposition. In one embodiment, the starting temperature is 160° C. to 500° C. In one embodiment, the starting temperature is 200° C. to 270° C. The temperature of the chamber and of the article may then be maintained at the starting temperature during deposition. In one embodiment, the IAD chamber includes heat lamps which perform the heating. In an alternative embodiment, the IAD chamber and article are not heated. If the chamber is not heated, it will naturally increase in temperature to about 160° C. as a result of the IAD process. A higher temperature during deposition may increase a density of the deposited material but may also increase a mechanical stress of the deposited material. Active cooling can be added to the chamber to maintain a low temperature during deposition. The low temperature may be maintained at any temperature at or below 160° C. down to 0° C. in one embodiment. In one embodiment, the article is cooled to maintain a temperature at or below 150° C. during deposition. Deposition temperature can be used to adjust film stress, crystallinity, and other coating properties.

Additional parameters that may be adjusted are working distance 270 and angle of incidence 272. The working distance 270 is the distance between the material source 250 and the article 200A, 200B. In one embodiment, the working distance is 0.2 to 2.0 meters, with a working distance of at or below 1.0 meters in one particular embodiment. Decreasing the working distance increases a deposition rate and increases an effectiveness of the ion energy. However, decreasing the working distance below a particular point may reduce a uniformity of the deposited layer. The working distance can be varied to achieve a deposited layer with a highest uniformity. Additionally, working distance may affect deposition rate and density of the deposited layer.

The angle of incidence is an angle at which the deposition materials 202 strike the articles 200A, 200B. The angle of incidence can be varied by changing the location and/or orientation of the substrate. In one embodiment the angle of incidence is 10-90 degrees, with an angle of incidence of about 30 degrees in one particular embodiment. By optimizing the angle of incidence, a uniform material deposition in three dimensional geometries can be achieved.

Co-deposition of multiple targets using multiple electron beam (e-beam) guns can be utilized to create thicker coatings, layered architectures, and complex multi-element layers. For example, two targets having the same material type may be used at the same time. Each target may be bombarded by a different electron beam gun. This may increase a deposition rate and a thickness of the deposited material. In another example, two targets may be different metallic materials. A first electron beam gun may bombard a first target to deposit a first metallic material, and a second electron beam gun may subsequently or simultaneously bombard the second target to deposit a second metallic material in a multi-layer architecture and/or as a complex multi-elemental compound. Alternatively, a single metal alloy may be used to form a complex multi-elemental compound.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
   forming, on a substrate of an image sensor by performing physical vapor deposition in vacuum, an absorber layer comprising copper (Cu), indium (In), gallium (Ga) and selenium (Se);
   forming a stack comprising the substrate and an oxygen-annealed absorber layer by performing in-situ oxygen annealing of the absorber layer to passivate selenium vacancies due to dangling bonds;
   forming a cap layer over the oxygen-annealed absorber layer by performing physical vapor deposition in vacuum, wherein the cap layer comprises at least one of: $Ga_2O_3 \cdot Sn$, ZnS, CdS, CdSe, ZnO, ZnSe, $ZnIn_2Se_4$, $CuGaS_2$, $In_2S_3$, MgO, or $Zn_{0.8}Mg_{0.2}O$; and
   forming, over the cap layer, a hole blocker layer comprising $Ga_2O_3$.

2. The method of claim 1, further comprising forming a bottom contact layer on the substrate prior to forming the absorber layer.

3. The method of claim 2, wherein the bottom contact layer comprises Mo, TiN, or a combination thereof.

4. The method of claim 1, further comprising forming a top contact layer over the hole blocker layer.

5. The method of claim 4, wherein the top contact layer comprises a conductive oxide.

6. The method of claim 5, wherein the top contact layer comprises at least one of: indium tin oxide (ITO), fluorine-doped tin oxide (FTO), aluminum-doped zinc oxide (AZO), gallium-doped zinc oxide (GZO), aluminum-gallium-zinc-oxide (AGZO), or boron-doped zinc oxide (BZO).

7. The method of claim 1, wherein the in-situ oxygen annealing occurs at a temperature from about 100° C. to about 500° C.

8. The method of claim 1, wherein the in-situ oxygen annealing occurs over a duration of from about 5 minutes to about 90 minutes.

9. The method of claim 1, wherein the image sensor has a quantum efficiency (QE) greater than about 50%, measured at a voltage of about-1 volt (V) and at a wavelength of about 940 nanometers (nm).

10. The method of claim 1, wherein the image sensor has a quantum efficiency (QE) greater than about 85%, measured at a voltage of about-1 volt (V) and at a wavelength of about 940 nanometers (nm).

11. The method of claim 1, wherein the image sensor has a capacitance lower than about 10 nanofarads per square centimeter ($nF/cm^2$), measured at a frequency of about 1 megahertz (MHz) and at a temperature of about 200° K.

12. The method of claim 1, wherein forming the cap layer further comprises forming the cap layer after forming the stack without an air break.

13. The method of claim 1, wherein:
    the stack is formed in a first chamber;
    the cap layer is formed in a second chamber different from the first chamber; and
    the method further comprises, prior to forming the cap layer, transferring the stack from the first chamber to the second chamber without an air break.

* * * * *